(12) United States Patent
Umehara et al.

(10) Patent No.: US 10,975,466 B2
(45) Date of Patent: Apr. 13, 2021

(54) METHOD OF CLEANING EXHAUST PIPE

(71) Applicant: Tokyo Electron Limited, Tokyo (JP)

(72) Inventors: Takahito Umehara, Iwate (JP); Masato Koakutsu, Iwate (JP); Tsubasa Watanabe, Iwate (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/120,596

(22) Filed: Sep. 4, 2018

(65) Prior Publication Data
US 2019/0078198 A1    Mar. 14, 2019

(30) Foreign Application Priority Data

Sep. 13, 2017    (JP) ................................ 2017-175907

(51) Int. Cl.
| | |
|---|---|
| *C23C 16/02* | (2006.01) |
| *B08B 5/00* | (2006.01) |
| *B08B 9/027* | (2006.01) |
| *H01L 21/67* | (2006.01) |
| *C23C 16/44* | (2006.01) |
| *C23C 16/34* | (2006.01) |

(52) U.S. Cl.
CPC ............ *C23C 16/0227* (2013.01); *B08B 5/00* (2013.01); *B08B 9/027* (2013.01); *C23C 16/345* (2013.01); *C23C 16/4405* (2013.01); *C23C 16/4412* (2013.01); *H01L 21/67017* (2013.01); *H01L 21/67028* (2013.01); *B08B 2209/027* (2013.01)

(58) Field of Classification Search
CPC .................. C23C 16/4412; C23C 16/4405
See application file for complete search history.

(56) References Cited

U.S. PATENT DOCUMENTS

| | | | | |
|---|---|---|---|---|
| 5,515,986 | A | * | 5/1996 | Turlot ................. C23C 16/5096 216/71 |
| 6,042,654 | A | * | 3/2000 | Comita ............... C23C 16/4405 134/2 |
| 2001/0054430 | A1 | * | 12/2001 | Katagiri .............. C23C 16/4405 134/1.1 |

(Continued)

FOREIGN PATENT DOCUMENTS

| | | |
|---|---|---|
| JP | 2002-334869 | 11/2002 |
| JP | 2013-151714 | 8/2013 |

(Continued)

*Primary Examiner* — Joseph A Miller, Jr.
(74) *Attorney, Agent, or Firm* — IPUSA, PLLC

(57) ABSTRACT

There is provision of a method of cleaning an exhaust pipe of a film forming apparatus for removing a component adhering to the exhaust pipe which is generated from a source gas for forming film supplied from a gas supply part to a processing chamber of the film forming apparatus. The method includes a step of supplying a cleaning gas directly, from a cleaning gas supply part disposed near a joint between the processing chamber and the exhaust pipe, to the exhaust pipe without passing through the processing chamber, in order to remove the component by causing the component to vaporize upon reacting with the cleaning gas. The cleaning gas to be supplied is capable of causing the component adhering to the exhaust pipe to change into an evaporable substance by chemical reaction in an atmosphere inside the exhaust pipe.

4 Claims, 10 Drawing Sheets

(56) References Cited

U.S. PATENT DOCUMENTS

| | | | | |
|---|---|---|---|---|
| 2005/0011445 A1* | 1/2005 | Upham | ................ | B08B 7/0035 |
| | | | | 118/715 |
| 2010/0112822 A1* | 5/2010 | Toratani | ............. | C23C 16/4405 |
| | | | | 438/758 |
| 2010/0159122 A1* | 6/2010 | Hosoi | ................ | C23C 16/4405 |
| | | | | 427/58 |
| 2011/0083606 A1* | 4/2011 | Rudhard | ............... | C23C 16/345 |
| | | | | 118/715 |

FOREIGN PATENT DOCUMENTS

| JP | 2016-141845 | 8/2016 |
|---|---|---|
| JP | 2019-050246 | 3/2019 |

\* cited by examiner

FIG.6
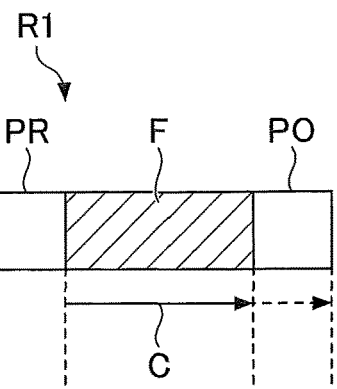
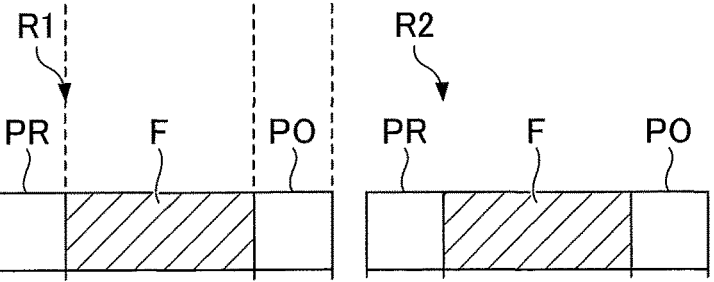
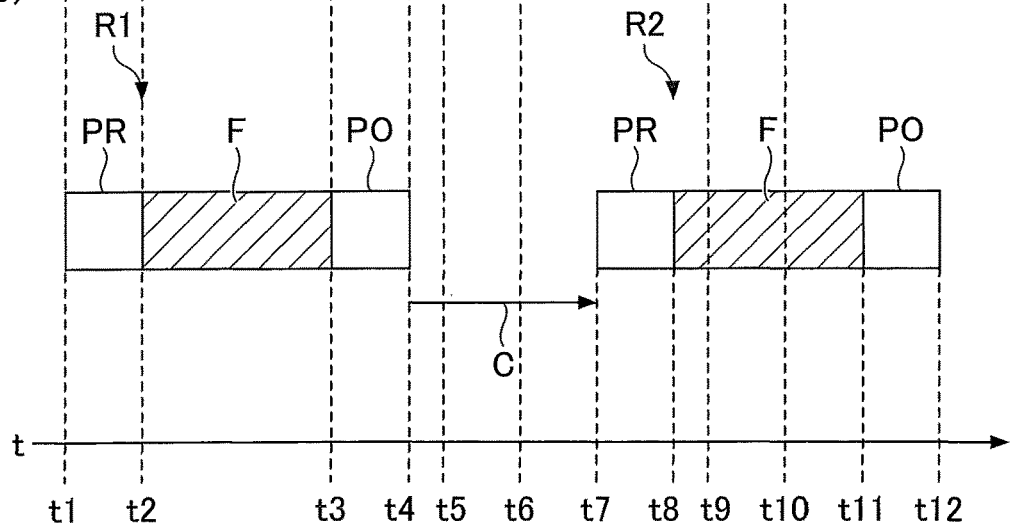

METHOD OF CLEANING EXHAUST PIPE

CROSS-REFERENCE TO RELATED APPLICATIONS

This patent application is based upon and claims the benefit of priority of Japanese Patent Application No. 2017-175907 filed on Sep. 13, 2017, the entire contents of which are incorporated herein by reference.

BACKGROUND OF THE INVENTION

1. Field of the Invention

The present invention generally relates to a cleaning method of an exhaust pipe.

2. Description of the Related Art

When a film forming apparatus forms film on a substrate, the substrate on which film is to be formed is held in a processing chamber, source gas is supplied, and desired film is formed on the substrate by ALD (Atomic Layer Deposition) or CVD (Chemical Vapor Deposition). When forming film, a byproduct generated by a chemical reaction of the source gas adheres to an exhaust pipe of the film forming apparatus. When the byproduct adhering to the exhaust pipe is removed from the exhaust pipe, the byproduct becomes particles. If the particles adhere to a substrate to which a film forming process is being applied, quality of formed film is degraded and yield rate is reduced. To reduce particles or the like, a byproduct or the like adhering to the exhaust pipe is removed by performing maintenance of the exhaust pipe.

A byproduct adhering to the exhaust pipe differs depending on a type of film to be formed or on a type of source gas. Patent Document 1 discloses a method of forming silicon nitride film by CVD, a film forming apparatus, and a pre-cleaning method of the film forming apparatus. The film forming apparatus disclosed in Patent Document 1 forms silicon nitride film on a semiconductor wafer by supplying hexachlorodisilane and ammonia, and a byproduct adhering to an exhaust pipe includes ammonium chloride and a compound containing Si—Cl—N—H. In the film forming apparatus disclosed in Patent Document 1, an exhaust pipe and a valve are heated at a temperature of 100° C. to 200° C., and ammonia is introduced from a process gas induction pipe to the exhaust pipe. Because the above operation is performed, adhesion of a byproduct to an exhaust pipe is reduced. Further, a problem, in which hydrochloric acid gas is produced because of occurrence of hydrolysis of a byproduct adhering to an exhaust pipe when the exhaust pipe is opened during maintenance, can be prevented.

Further, when a film forming process for using gas containing a harmful substance as a source gas is to be performed, the source gas may adhere to an exhaust pipe and may remain in the exhaust pipe. Patent Document 2 discloses a method of detoxifying an exhaust pipe and a film forming apparatus employing ALD.

However, one of byproducts generated by a chemical reaction that occurs when a film forming process using hexachlorodisilane as a source gas is performed is chlorosilane polymer. Because chlorosilane polymer is an extremely flammable and pyrophoric substance, it is necessary either not to generate chlorosilane polymer, or, even if chlorosilane polymer is produced, to remove chlorosilane polymer safely.

Also, a product generated by hydrolysis of chlorosilane polymer is an extremely hazardous substance. In a case in which an exhaust pipe to which chlorosilane polymer may possibly be adhering is required to be opened to the atmosphere during maintenance, it is required that an atmosphere around a part of the exhaust pipe to be opened to the atmosphere be replaced by nitrogen gas atmosphere before the part is opened to the atmosphere. That is, by using a glove bag procedure or the like, after the part is made to a state isolated from atmospheric moisture, the part is opened to the atmosphere.

If an exhaust pipe is opened to the atmosphere after the exhaust pipe is isolated from atmospheric moisture, maintenance work can be performed safely. However, because this method requires a procedure that air around a part of the exhaust pipe to be opened to the atmosphere is replaced by a nitrogen gas atmosphere, workability degrades and an area that can be isolated is very narrow. Therefore, there is a need for a method of cleaning an exhaust pipe capable of performing maintenance of an exhaust pipe by safely opening the exhaust pipe to the atmosphere, without requiring isolation.

CITATION LIST

Patent Document

[Patent Document 1] Japanese Laid-open Patent Application Publication No. 2002-334869
[Patent Document 2] Japanese Laid-open Patent Application Publication No. 2016-141845

SUMMARY OF THE INVENTION

A method of cleaning an exhaust pipe according to an embodiment is for cleaning the exhaust pipe of a film forming apparatus including a processing chamber, a gas supply part configured to supply gas to the processing chamber, and a cleaning gas supply part disposed in a vicinity of a joint between the processing chamber and the exhaust pipe, in order to remove a component adhering to the exhaust pipe which is generated from a source gas for forming film when the source gas is supplied into the processing chamber from the gas supply part. The method includes a step of supplying a cleaning gas from the cleaning gas supply part directly to the exhaust pipe without passing through the processing chamber, in order to remove the component by causing the component to vaporize upon reacting with the cleaning gas. The cleaning gas to be supplied is capable of causing the component adhering to the exhaust pipe to change into an evaporable substance by chemical reaction in an atmosphere inside the exhaust pipe.

Another method of cleaning an exhaust pipe according to another embodiment is for cleaning the exhaust pipe of a film forming apparatus including a processing chamber, and a gas supply part configured to supply gas to the processing chamber, in order to remove a component adhering to the exhaust pipe which is generated from a source gas for forming film when the source gas is supplied into the processing chamber from the gas supply part. The method includes a step of supplying a cleaning gas from the gas supply part to the exhaust pipe via the processing chamber while the film forming apparatus is operating but a film forming process is not performed in the processing chamber, in order to remove the component by causing the component to vaporize upon reacting with the cleaning gas. The cleaning gas to be supplied is capable of causing the component adhering to the exhaust pipe to change into an evaporable substance by chemical reaction in an atmosphere inside the exhaust pipe.

BRIEF DESCRIPTION OF THE DRAWINGS

FIG. 6 is a set of timing charts illustrating examples of operations of the film forming apparatus according to the embodiment;

DETAILED DESCRIPTION OF EMBODIMENTS

Figure 1:
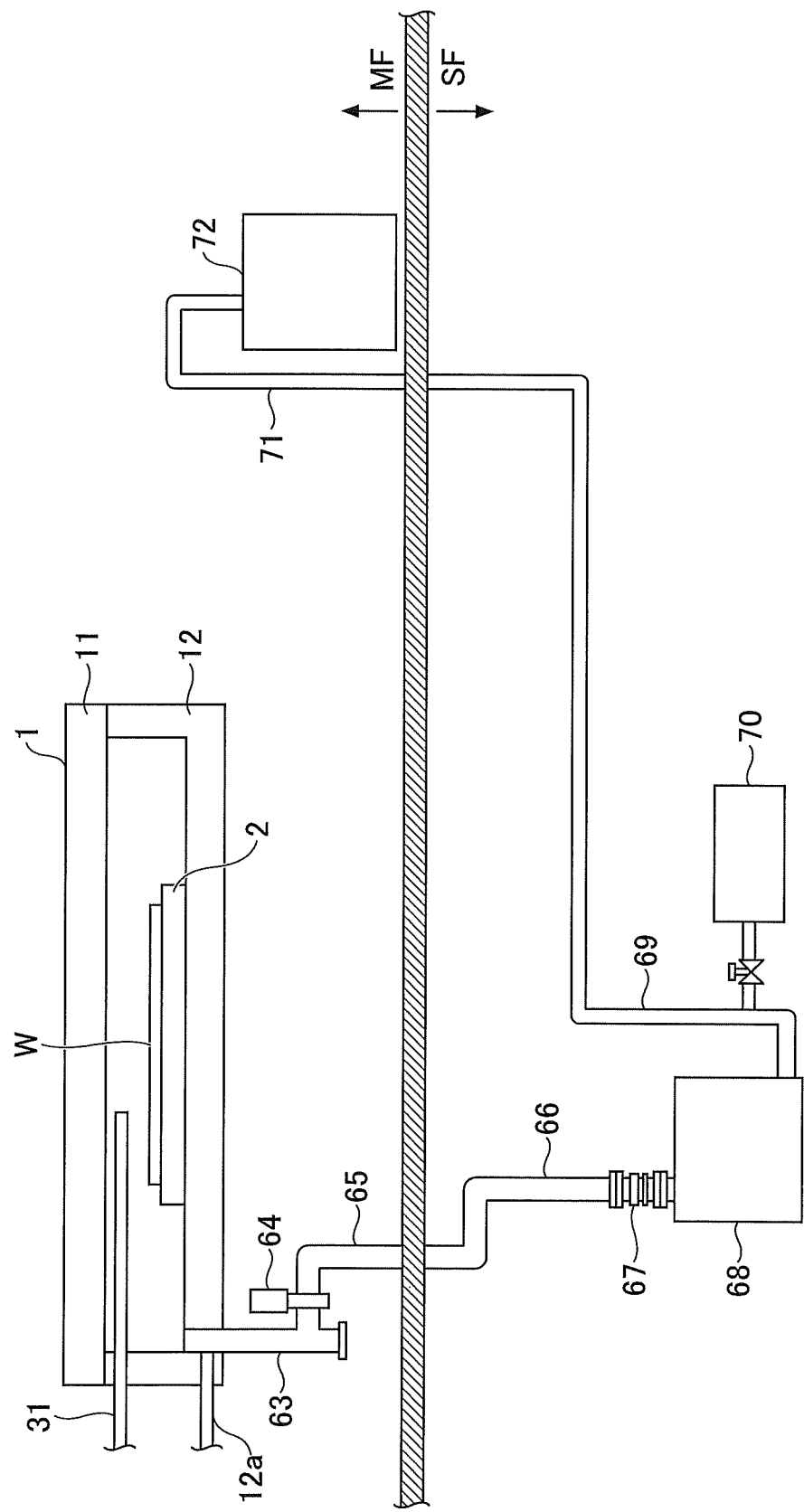
FIG. 1 is a schematic diagram illustrating an example of an exhaust pipe of a film forming apparatus according to an embodiment.

Embodiments of the present invention will be described in the following. Note that in the following descriptions and the drawings, elements having substantially identical features are given the same reference symbols and overlapping descriptions may be omitted.

First, byproducts which are produced by a reaction during a film forming process will be described.

[Byproducts Produced by a Reaction During a Film Forming Process]

For example, in a film forming process of silicon nitride film employing ALD, chlorosilanes such as dichlorosilane, trichlorosilane, tetrachlorosilane, and hexachlorosilane, and ammonia are used as source gases. When chlorosilanes are used as source gases, chlorosilane polymer is produced as byproducts, as illustrated in formulas (1) to (3) described below.

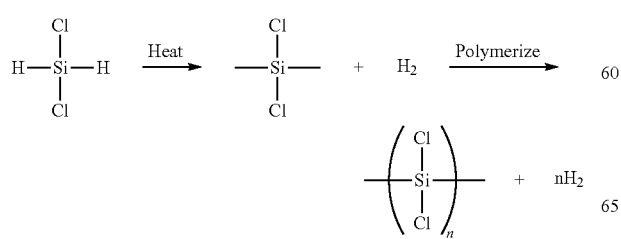

(1)

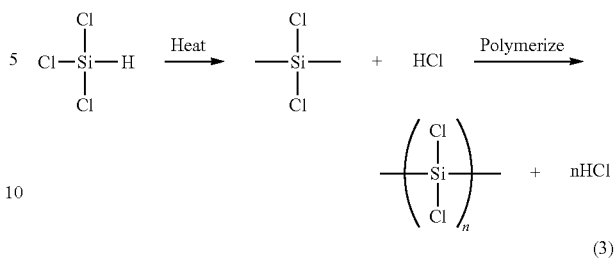

(2)

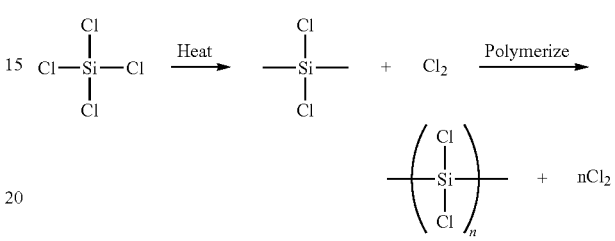

(3)

The formula (1) represents that $H_2$ is removed from dichlorosilane by heat and chlorosilane polymer is produced by polymerization. The formula (2) represents that HCl is removed from trichlorosilane by heat and chlorosilane polymer is produced by polymerization. The formula (3) represents that $Cl_2$ is removed from tetrachlorosilane by heat and chlorosilane polymer is produced by polymerization. For example, chlorosilane polymer is produced in an exhaust system by polymerizing chlorosilane monomers produced during a film forming process.

Although chlorosilane polymer has low friction sensitivity and low ignition sensitivity, chlorosilane polymer is flammable and explosive. When chlorosilane polymer after hydrolysis is dried and temperature decreases, explosive force and impact sensitivity increase (details of chlorosilane hydrolysate will be described below).

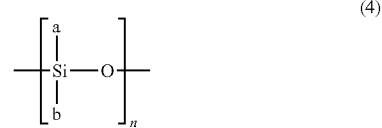

(4)

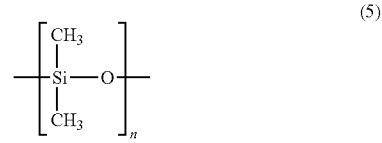

(5)

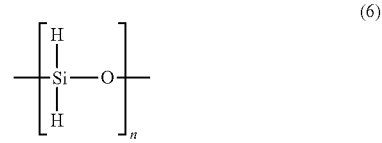

(6)

(7)

Also, when chlorosilanes are used as source gases, polysiloxane is produced as a byproduct. A basic structure of polysiloxane is illustrated in the above formula (4). Polysiloxane has a silicon-oxygen backbone chain (Si—O—Si), and has different characteristics depending on substituents a and b. The above formula (5) represents a structure of flammable silicone oil, and represents a case in which both the substituents a and b are methyl groups (—CH$_3$). The above formula (6) represents a structure of unstable and extremely flammable reactive polysiloxane, and represents a case in which both the substituents a and b are hydrogen (—H). The above formula (7) represents a structure of stable polysiloxane, and represents a case in which both the substituents a and b are hydroxyl groups (—OH). Polysiloxane is in a form of a gel-like semisolid, or a solid. Polysiloxane of which both the substituents a and b are hydrogen (—H) is the most flammable polysiloxane. Under an environment in which an oxidizer such as air exists, the polysiloxane may explosively react by slight energy, such as a mechanical impact or reaction heat, and a burning velocity is extremely high.

The above reactive polysiloxane is generated, for example, in accordance with a chemical reaction represented by a formula (8) described below. For example, by hydrolysis, dichlorosilane 8a will change to chlorosilanol 8b with HCl. By dehydrochlorination reaction, reactive polysiloxane 8c having a structure corresponding to the formula (6) which includes a repeating unit of [SiH$_2$—O] is generated from chlorosilanol 8b and dichlorosilane 8a, by bonding an oxygen atom of a hydroxyl in the chlorosilanol 8b to a silicon atom in the dichlorosilane 8a. The reactive polysiloxane 8c is further polymerized by dehydrochlorination and hydrolysis being repeated.

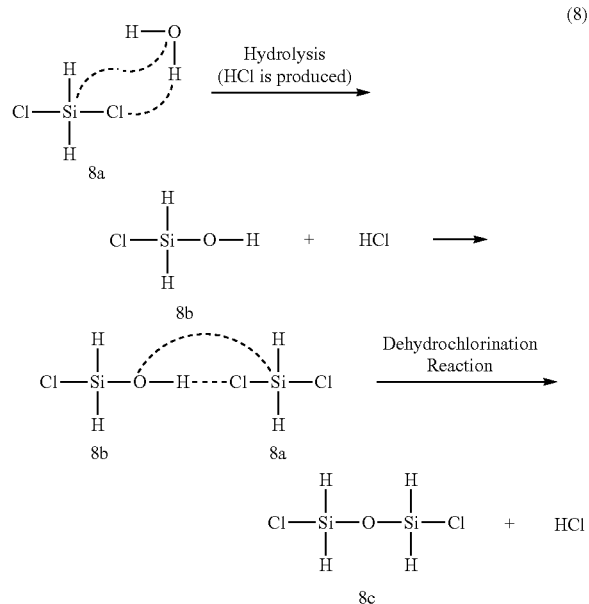

Further, the above stable polysiloxane is generated in accordance with, for example, a chemical reaction represented by a formula (9) described below. For example, as chlorosilane polymer 9a is easily hydrolyzed, chlorosilane polymer 9a is changed into chlorosilane polymer hydrolysate 9b by hydrolysis. During the hydrolysis, HCl is also generated and heat of reaction is emitted. The chlorosilane polymer hydrolysate 9b includes a repeating unit of [Si(OH)$_2$—Si(OH)$_2$]. As illustrated in the formula (9), by reacting with water (H$_2$O), the chlorosilane polymer hydrolysate 9b is rearranged such that an oxygen atom is inserted between two silicon atoms and such that the oxygen atom is bonded to the two silicon atoms (see a chemical structure 9c in the formula (9)). As a result, the chlorosilane polymer hydrolysate 9b is changed into stable polysiloxane 9d having a structure corresponding to the formula (7) which includes a repeating unit of [Si(OH)$_2$—O]. However, the chlorosilane polymer hydrolysate 9b is likely to ignite or explode by impact or heat. After chlorosilane polymer 9a is changed to chlorosilane polymer hydrolysate 9b, if the chlorosilane polymer hydrolysate 9b becomes in a state in which the chemical reaction of changing the chlorosilane polymer hydrolysate 9b into the stable polysiloxane 9d via the chemical structure 9c does not proceed (that is, in a case in which the chlorosilane polymer hydrolysate 9b becomes dried or a temperature of the chlorosilane polymer hydrolysate 9b decreases), the chlorosilane polymer hydrolysate 9b likely to ignite or explode still remains.

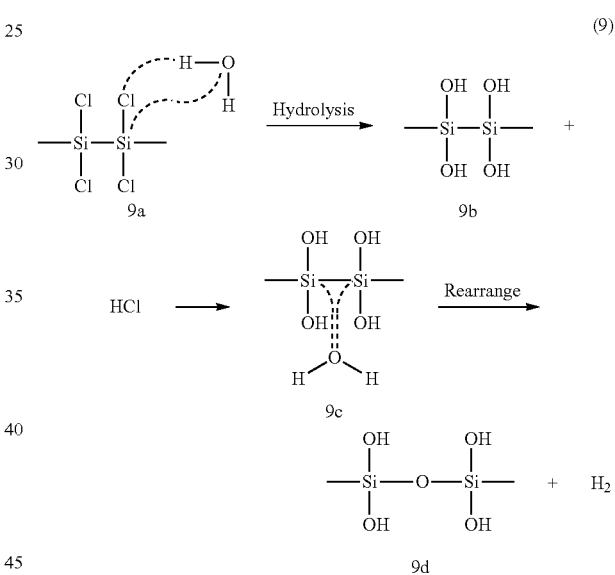

Further, when chlorosilanes are used as source gases, silico-oxalic acid is produced as a byproduct. A chemical reaction of generating silico-oxalic acid from hexachlorodisilane will be described in a formula (10) below. For example, as illustrated in a formula (10b) in the formula (10), by hexachlorodisilane 10a being hydrolyzed, an oxygen atom from water is double bonded to an Si atom, a hydroxyl group from water is bonded to the Si atom, and silico-oxalic acid 10c is generated with HCl. For example, if chloropolysilanes such as hexachlorodisilane condense in an exhaust system and if the chloropolysilanes are hydrolyzed with moisture in the atmosphere while an exhaust pipe is being opened to the atmosphere, silico-oxalic acid may be generated in the exhaust system. Silico-oxalic acid is flammable and is likely to ignite by small impact or heat caused by friction. Especially in a dry state, silico-oxalic acid causes an explosive reaction, and a power of the explosive reaction is strong. For example, silico-oxalic acid may ignite at a temperature of 300° C. to 350° C.

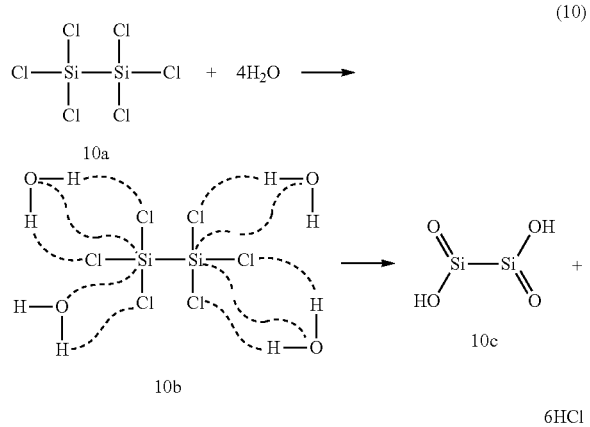

Other examples of a byproduct include $Si_xH_y$, $Si_xCl_y$, and $Si_xH_yCl_z$. $Si_xH_y$ is amorphous silicon powder including an Si—H bond, and emits a large amount of energy when $Si_xH_y$ is burned. If $Si_xH_y$ reacts with acid aqueous solution, $H_2$ or $SiH_4$ may be generated. $Si_xCl_y$ and $Si_xH_yCl_z$ are transparent and viscous liquid. When $Si_xCl_y$ and $Si_xH_yCl_z$ react with a small amount of water, flammable polysiloxane may be generated as an unstable intermediate. In a course of the reaction, HCl or $H_2$ is generated. Further, $Si_xCl_y$ and $Si_xH_y$-$Cl_z$ may directly react with oxygen in the atmosphere. Especially, as illustrated in the above formula (8), when dichlorosilane directly reacts with water, flammable reactive polysiloxane is generated.

Among the above identified byproducts, chlorosilane polymer hydrolysate, reactive polysilane, and silico-oxalic acid are a type of a byproduct likely to burn or explode by impact or heat. Among them, reactive polysilane, and silico-oxalic acid are not likely to be generated in an exhaust pipe of a film forming apparatus, when the film forming apparatus and the exhaust pipe are in a normal operating state isolated from water. Also, chlorosilane polymer hydrolysate is not likely to be generated in an exhaust pipe, when the exhaust pipe is isolated from water. However, chlorosilane polymer can be generated if no water is present. Therefore, during a normal operating state of the film forming apparatus and the exhaust pipe, it is important to pay attention to chlorosilane polymer which may adhere to the exhaust pipe.

[Exhaust Pipe of Film Forming Apparatus]

An exhaust pipe to which a cleaning method of an exhaust pipe according to the present embodiment is applied will be described with reference to FIG. 1. FIG. 1 is a schematic diagram illustrating an example of an exhaust pipe of a film forming apparatus according to the present embodiment.

As illustrated in FIG. 1, for example, a processing chamber 1 of the film forming apparatus includes a vessel body 12 and a ceiling plate 11. Also, a susceptor 2 is provided in the film forming apparatus, and a substrate to which a film forming process is applied (hereinafter referred to as a "wafer W") is placed on the susceptor 2. At a bottom of the processing chamber 1, an exhaust pipe 63 used for discharging gas in the processing chamber 1 is connected. Also, a process gas nozzle 31 is provided to the processing chamber 1, which is used for supplying gas such as source gas for a film forming process inside the processing chamber 1. Further, in a vicinity of a location where the exhaust pipe 63 is connected to the processing chamber 1 (hereinafter, the location may also referred to as a "joint"), a cleaning gas supplying tube 12a, which is a cleaning gas supplying unit for supplying cleaning gas, is provided.

An automatic pressure regulator 64 is connected to the exhaust pipe 63. An exhaust pipe 65 is also connected to the exhaust pipe 63. The above mentioned elements from processing chamber 1 to the exhaust pipe 65 are provided in a film forming apparatus main facility MF. The exhaust pipe 65 is connected to an exhaust pipe 66, by penetrating a floor separating the film forming apparatus main facility MF and a film forming apparatus sub facility SF. The exhaust pipe 66 is connected to a dry pump 68 via a flexible pipe 67. The dry pump 68 is connected to an exhaust pipe 69. In the middle of the exhaust pipe 69, a Fourier transform infrared spectrometer 70 (FT-IR spectrometer 70) is connected. The exhaust pipe 69 is connected to an exhaust pipe 71, by penetrating the floor separating the film forming apparatus main facility MF and the film forming apparatus sub facility SF. The above mentioned elements from the exhaust pipe 66 to the exhaust pipe 69 are provided in the film forming apparatus sub facility SF. The exhaust pipe 71 is connected to a detoxifying device 72. The above mentioned exhaust pipe 71 and detoxifying device 72 are provided in the film forming apparatus main facility MF. A set of elements from the exhaust pipe 63 to the detoxifying device 72 in the above described film forming apparatus is collectively referred to as an "exhaust system".

To the exhaust pipes 63, 65, 66, 69, and (also including the flexible pipe 67) and valves attached to these pipes, which are included in the above mentioned exhaust system, heaters (not illustrated) capable of heating, for example, up to 200° C. are attached. When the cleaning method of an exhaust pipe according to the present embodiment is to be performed, a temperature of the exhaust pipes 63, 65, 66, 69, and 71 (including the flexible pipe 67) is set to, for example, not more than 90° C.

[Film Forming Apparatus]

The film forming apparatus to which the cleaning method of an exhaust pipe according to the present embodiment is applied will be described. First, with reference to FIGS. 2 to 5, an example of the film forming apparatus according to the present embodiment will be described. The film forming apparatus according to the present embodiment is a film forming apparatus to which the cleaning method of an exhaust pipe according to the present embodiment can be suitably applied. The film forming apparatus to be described here employs what is called a rotary table-type susceptor (to be described below). In the film forming apparatus, by supplying process gas containing source gas to a given gas supplying region, film is formed on surfaces of multiple substrates. However, a susceptor on which a substrate is placed is not necessarily of a rotary table-type, and the method according to the present embodiment is applicable to various types of film forming apparatuses using a nozzle.

Figure 2:
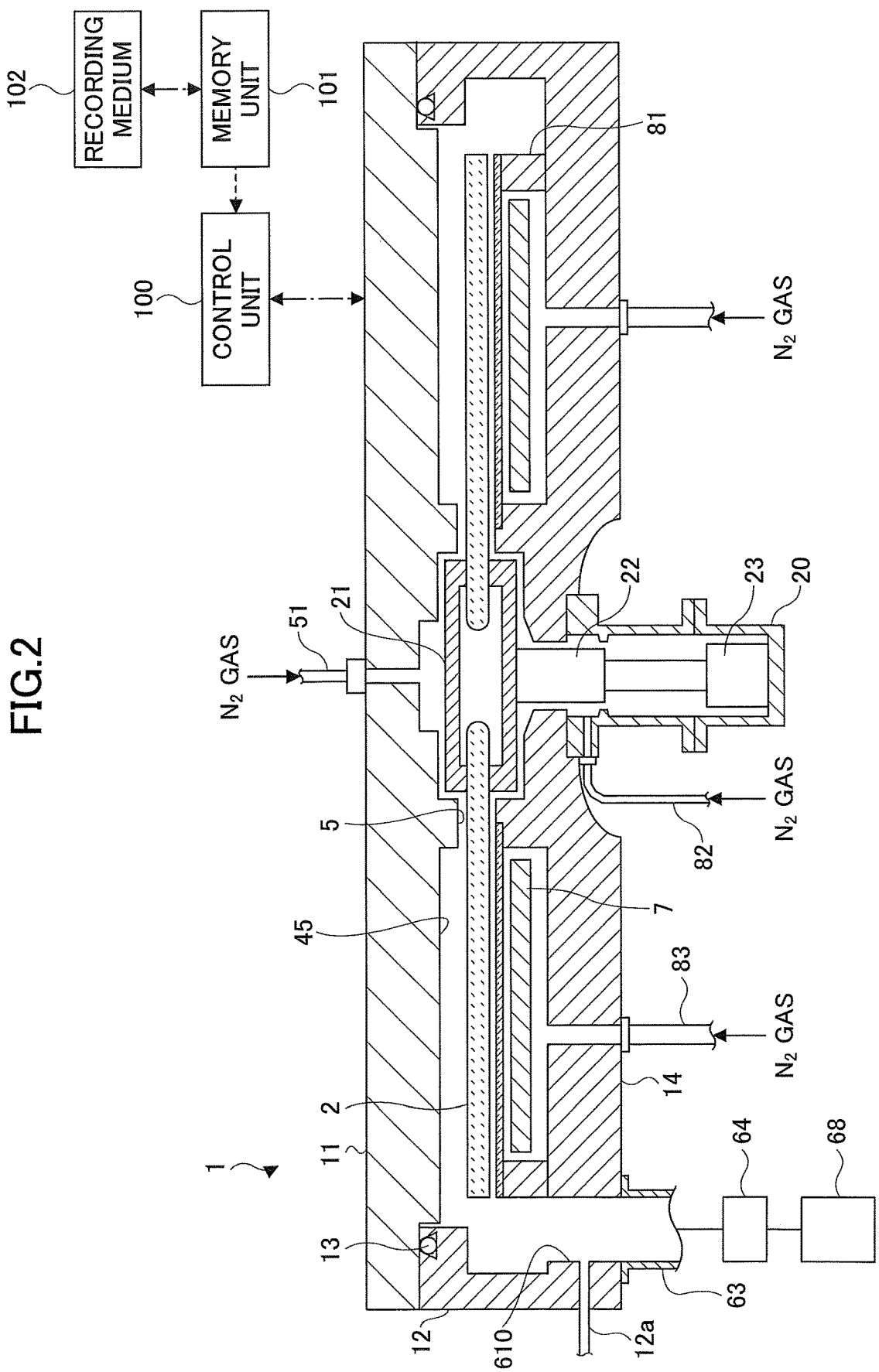
FIG. 2 is a cross-sectional view of the film forming apparatus according to the embodiment.
Figure 3:
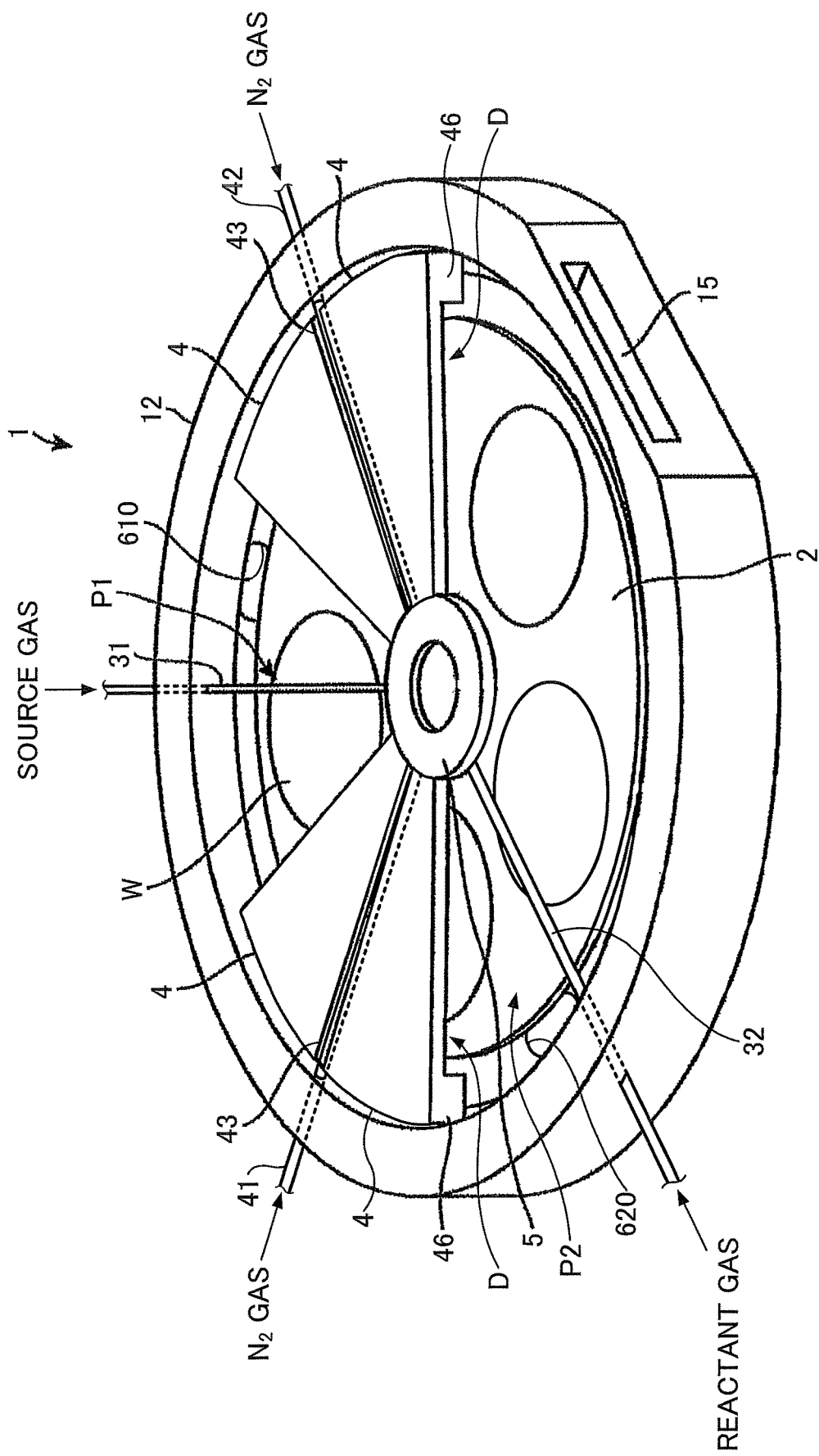
FIG. 3 is a perspective view illustrating an internal structure of the processing chamber of the film forming apparatus in FIG. 2.
Figure 4:
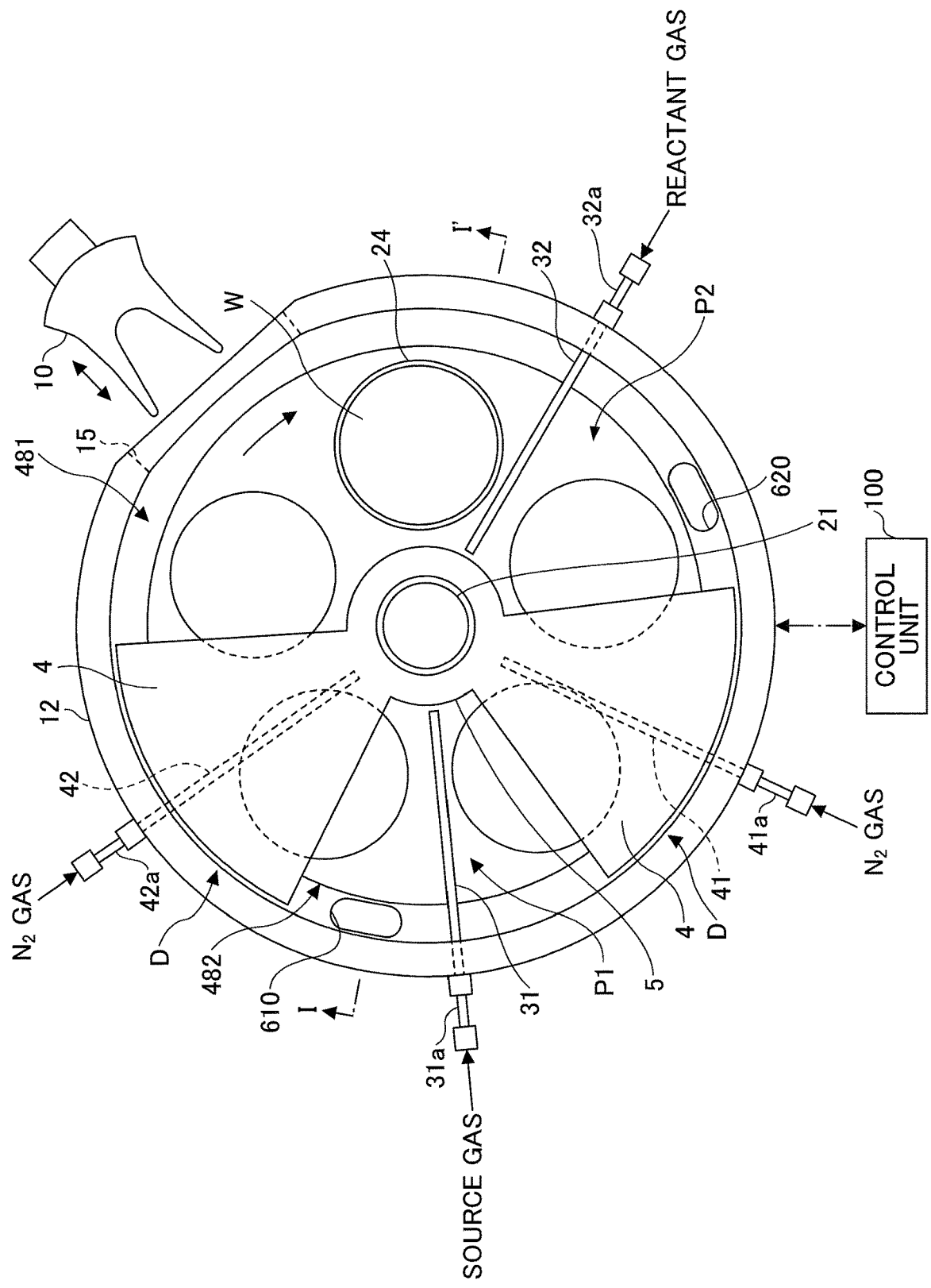
FIG. 4 is a plan view illustrating the internal structure of the processing chamber of the film forming apparatus in FIG. 2.

FIG. 2 is a cross-sectional view of the film forming apparatus, and illustrates a cross-section taken along line I-I' of FIG. 4. FIGS. 3 and 4 are views illustrating an internal structure of the processing chamber 1. In FIGS. 3 and 4, illustration of the ceiling plate 11 is omitted for convenience of description.

Figure 5:
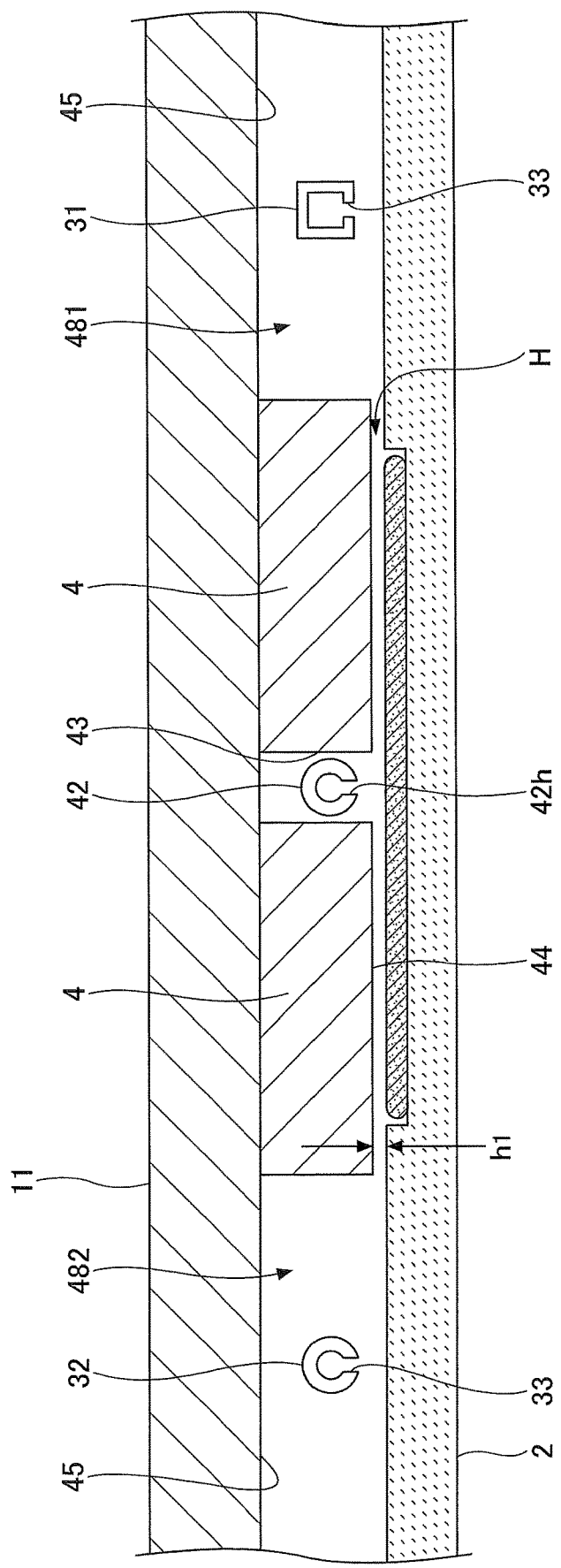
FIG. 5 is a partial sectional view of the film forming apparatus in FIG. 2.

FIG. 5 is a cross-sectional view of the processing chamber 1 taken along a concentric circle of the susceptor 2 from the process gas nozzle 31 to a process gas nozzle 32 (to be described later).

As illustrated in FIGS. 2 to 4, the film forming apparatus includes the flat processing chamber 1 having a substantially circular planar shape, the susceptor 2 provided in the processing chamber 1, and a control unit (control means) 100 for controlling an overall operation (for example, a gas supply timing of the process gas nozzles 31 and 32) of the film forming apparatus.

The processing chamber 1 has the vessel body 12 having a cylindrical shape with a bottom and has the ceiling plate 11 airtightly and detachably disposed on an upper surface of the vessel body 12. For example, the ceiling plate 11 is airtightly and detachably disposed with a seal member 13 (FIG. 2) such as an O-ring, and secures airtightness of the interior of the processing chamber 1.

The susceptor 2 is fixed to a cylindrical core part 21 received in a case body 20 to rotate about the center of the processing chamber 1. The susceptor 2 includes a placing part formed on an upper surface of the susceptor 2, and multiple substrates (hereinafter, referred to as "wafers W") are placed on the placing part.

The case body 20 is a cylindrical case with an upper surface thereof opened. The case body 20 is installed such that a flange portion provided at an upper surface of the case body 20 becomes airtight with a lower surface of a lower part 14 of the processing chamber 1. An internal ambiance of the case body 20 is isolated from an external ambiance.

The core part 21 is fixed to an upper end of a rotational shaft 22 extending in a vertical direction. The rotational shaft 22 passes through the lower part 14 of the processing chamber 1. Further, a lower end of the rotational shaft 22 is attached to an actuating unit 23 for rotating the rotational shaft 22 around the vertical axis. Also, the rotational shaft 22 and the actuating unit 23 are stored in the case body 20.

As illustrated in FIG. 4, a surface of the susceptor 2 has multiple circular recesses 24 (substrate placing regions) for placing multiple wafers W (five wafers in this embodiment) in a rotation direction (in a circumferential direction). Here, in FIG. 4, a wafer W is illustrated in only one recess 24 for convenience of description. Note that the susceptor 2 capable of being used in the present disclosure may be configured such that four or less, or six or more wafers W as multiple substrates may be placed.

In the present embodiment, the recess 24 may have an inner diameter (for example, an inner diameter greater than a diameter of the wafer W by 4 mm) slightly greater than a diameter (for example, 300 mm) of the wafer W. Also, the recess 24 may have a depth substantially equal to a thickness of the wafer W. Thus, in the film forming apparatus, when the wafer W is placed on the recess 24, the surface of the wafer W and the surface of the susceptor 2 (region in which the wafer W is not loaded) can be substantially the same in height.

In the film forming apparatus, the process gas nozzle 31 is a first gas supply part, and is disposed in a first process region (to be described below) partitioned in an upper portion of the susceptor 2. The process gas nozzle 31 is used as a source gas supply nozzle for supplying a source gas to the wafer W. The process gas nozzle 32 is a second gas supply part, and used as a reactant gas supply nozzle for supplying a reactant gas that reacts with a source gas to generate a reaction product. The process gas nozzle 32 is disposed in a second process region (to be described below) spaced apart from the first process region along the circumferential direction of the susceptor 2. The separation gas nozzles 41 and 42 are separation gas supply parts and are disposed between the first process region and the second process region (hereinafter, simply referred to as "gas nozzles 31, 32, 41, and 42"). Also, nozzles formed of, for example, quartz, may be used as the gas nozzles 31, 32, 41, and 42.

Specifically, as illustrated in FIGS. 3 and 4, in the film forming apparatus, the process gas nozzle 32, the separation gas nozzle 41, the process gas nozzle 31, and the separation gas nozzle 42 are arranged at intervals in the circumferential direction of the processing chamber 1, in an order of the process gas nozzle 32, the separation gas nozzle 41, the process gas nozzle 31, and the separation gas nozzle 42 in a clockwise direction (the rotation direction of the susceptor 2) from a transfer port 15 used for loading a substrate. Gas introduction ports 31a, 32a, 41a, and 42a (FIG. 4), as base ends of the gas nozzles 31, 32, 41, and 42 respectively, are fixed to an outer circumferential wall of the vessel body 12. Further, the gas nozzles 31, 32, 41, and 42 are introduced from an outer circumferential wall of the processing chamber 1 into the processing chamber 1. Also, the gas nozzles 31, 32, 41, and 42 are installed towards the center of the susceptor 2 along a radial direction of the vessel body 12, and also installed to extend parallel with respect to the susceptor 2.

The gas nozzles 31 and 32 have multiple gas discharge holes 33 (see FIG. 5) opened downwardly toward the susceptor 2. The openings of the gas nozzles 31 and 32 may be arranged at an interval of, for example, 10 mm, in a longitudinal direction of the nozzles. Thus, a region below the process gas nozzle 31 becomes a region in which a source gas is adsorbed to the wafer W (hereinafter, referred to as a "first process region P1"). Also, a region below the process gas nozzle 32 becomes a region (hereinafter, referred to as a "second process region P2"), in which a reactant gas is reacted with a source gas adsorbed to the wafer W and a reaction product of the source gas and the reactant gas is deposited. Since the first process region P1 is a region to which the source gas is supplied, it may be termed as a "source gas supply region P1", and since the second process region P2 is a region to which the reactant gas that reacts with the source gas is supplied, it may be termed as a "reactant gas supply region P2".

For example, in a case in which silicon nitride film is to be formed, gas of a compound containing Si and at least one of Cl and H can be used as the source gas. The gas may be, for example, made into chlorosilane polymer in the exhaust pipe. For example, silicon-containing gas such as chlorosilanes such as dichlorosilane, trichlorosilane, tetrachlorosilane, and hexachlorosilane, may be used. Alternatively, as silicon-containing gas, silanes such as silane or disilane may be used.

For example, in a case in which silicon nitride film is to be formed, a byproduct generated by a chemical reaction of a source gas may adhere to an exhaust pipe. An example of the byproduct is chlorosilane polymer. As described above, if chlorosilane polymer is hydrolyzed, chlorosilane polymer is changed into chlorosilane polymer hydrolysate. In the cleaning method of an exhaust pipe according to the present embodiment, chlorosilane polymer or the like is removed by vaporizing the chlorosilane polymer or the like. Details of the method will be described below.

A source gas is not limited to the above mentioned gases, and various types of gas may be used as a source gas.

The process gas nozzle 32 is disposed in the reactant gas supply region P2 partitioned over the upper surface of the susceptor 2.

Each of the separation gas nozzles 41 and 42 is provided between the first process region P1 and the second process region P2 spaced apart from each other in the circumferential direction. The separation gas nozzles 41 and 42 are connected to a separation gas supply source through a pipe (not illustrated) or the like. That is, the separation gas nozzles 41 and 42 are configured to supply a separation gas to the upper surface of the susceptor 2.

As the reactant gas, various types of reactant gases capable of reacting with a source gas may be used. For example, a nitriding gas containing nitride, or an oxidation gas containing oxygen may be used. In the present embodiment, an example of using a nitriding gas or an oxidation gas as a reactant gas will be described. An example of a nitriding gas includes ammonia. Examples of the oxidation gas include an oxygen gas, an ozone gas, and water vapor. That is, a source gas that is supplied from the process gas nozzle 31 and is adsorbed to the substrate is nitrided or oxidized by the reactant gas supplied from the process gas nozzle 32, to generate a nitride or an oxide.

Inert gas is used as a separation gas in the film forming apparatus. The inert gas is, for example, a rare gas such as Ar or He, or a nitrogen gas. The separation gas is used as a purge gas for purging the wafer W. In the present embodiment, an example in which $N_2$ gas, generally used as a purge gas, is used as the separation gas will be described.

As illustrated in FIGS. 3 and 4, two convex shape parts 4 are provided in the processing chamber 1 of the film forming apparatus. The convex shape part 4 has a substantially fan-like planar shape of which a top portion is cut into an arc-like shape. In the present embodiment, an inner circular arc of the convex shape part 4 is connected to a protrusion 5. Also, an outer arc of the convex shape part 4 is arranged along an inner circumference of the vessel body 12 of the processing chamber 1.

Specifically, as illustrated in FIG. 5, the convex shape part 4 is installed on a back surface of the ceiling plate 11. Also, a lower surface of the convex shape part 4 includes a flat low ceiling surface 44 (a first ceiling surface), with a ceiling surface 45 (a second ceiling surface) being positioned on both circumferential sides of the ceiling surface 44. Here, the ceiling surface 45 of the convex shape part 4 is a ceiling surface higher than the ceiling surface 44. Thus, the convex shape part 4 forms, in the processing chamber 1, a separation space H which is a narrow space, and spaces 481 and 482 to which a gas is introduced from the separation space H. That is, the separation space H, which is a narrow space formed by the convex shape part 4, serves as a separation region D illustrated in FIG. 3, which will be described below.

Further, as illustrated in FIG. 5, the convex shape part 4 includes a groove 43 at the center of the circumferential direction. The groove 43 extends in a radial direction of the susceptor 2. Also, the groove 43 accommodates the separation gas nozzle 42. Another convex shape part 4 also includes the groove 43, and the separation gas nozzle 41 is accommodated in the groove 43.

Further, gas discharge holes 42h are formed on a lower surface of the separation gas nozzle 42, that is, on a surface facing the susceptor 2. The multiple gas discharge holes 42h are formed at a predetermined interval (for example, 10 mm) in a longitudinal direction of the separation gas nozzle 42. Also, a diameter of an opening of the gas discharge hole 42h ranges from, for example, 0.3 to 1.0 mm. Although not illustrated, the gas discharge holes 42h are also formed on the separation gas nozzle 41.

Also, as illustrated in FIG. 5, in the film forming apparatus, the process gas nozzles 31 and 32 are provided in spaces below the higher ceiling surface 45. The process gas nozzles 31 and 32 are spaced apart from the ceiling surface 45 and disposed near the wafer W. Also, as illustrated in FIG. 5, the process gas nozzle 31 is provided in the space 481 (space below the higher ceiling surface 45), and the process gas nozzle 32 is provided in the space 482 (space below the higher ceiling surface 45).

The process gas nozzles 31 and 32 are disposed in a vicinity of the surface of the wafer W, and the discharge holes 33 are formed on lower surfaces of the process gas nozzles 31 and 32 to face the surface of the wafer W. A distance between the discharge hole 33 of the process gas nozzle 31 or 32 and a surface on which the recess 24 of the susceptor 2 is not formed is set to a range of, for example, 1 to 5 mm, and preferably set to approximately 3 mm. Also, as illustrated in FIG. 5, the process gas nozzle 31 for supplying a source gas may have a rectangular cross-sectional shape. Also, another process gas nozzle 32 and the separation gas nozzles 41 and 42 may have a ring shape cross-section.

The lower ceiling surface 44 forms the separation space H which is a narrow space, with respect to the susceptor 2. When inert gas (such as $N_2$ gas) is supplied from the separation gas nozzle 42, the inert gas flows into the separation space H and is discharged toward the space 481 and the space 482. Because a volume of the separation space H is smaller than that of the spaces 481 and 482, the film forming apparatus can cause a pressure of the separation space H to be higher than that of the spaces 481 and 482, by using the supplied inert gas. That is, the separation space H forms a pressure barrier in a gap between the spaces 481 and 482.

Further, the inert gas discharged from the separation space H to the spaces 481 and 482 acts as a counter flow with respect to a first process gas (source gas) of the first process region P1 and a second process gas (reactant gas) of the second process region P2. Thus, in the film forming apparatus, the first process gas of the first process region P1 and the second process gas of the second process region P2 are separated by using the separation space H. That is, the film forming apparatus is configured to prevent the first process gas and the second process gas from being mixed to react with each other within the processing chamber 1.

Further, a height h1 of the ceiling surface 44 from the upper surface of the susceptor 2 may be a height appropriate for having a pressure of the separation space H higher than a pressure of the spaces 481 and 482, based on a pressure in the processing chamber 1, a rotation speed of the susceptor 2, a supply amount of the separation gas (N2 gas), and the like when film is formed. Also, the height h1 of the ceiling surface 44 from the upper surface of the susceptor 2 may be a height corresponding to a specification of the film forming apparatus and a type of the supplied gas. Also, the height h1 of the ceiling surface 44 from the upper surface of the susceptor 2 may be determined in advance, through experimentation, calculation, or the like.

As illustrated in FIGS. 3 and 4, the protrusion 5 is formed on a lower surface of the ceiling plate 11 to surround an outer circumference of the core part 21 for fixing the susceptor 2. In the present embodiment, the protrusion 5 is connected with a portion of the rotation center area of the convex shape part 4, and a lower surface of the protrusion 5 is formed to have the same height as that of the ceiling surface 44.

As illustrated in FIG. 3, a bent portion 46 is formed to be bent in an L shape to face an outer end surface of the susceptor 2 in a circumferential portion (close to an outer edge of the processing chamber 1) of the convex shape part 4 having a substantially fan-like shape. The bent portion 46 suppresses gas distribution between the space 481 and the space 482 through a space between the susceptor 2 and an inner circumferential surface of the vessel body 12. The fan-like convex shape part 4 is installed on the ceiling plate 11.

Because the film forming apparatus is configured such that the ceiling plate 11 can detached from the vessel body 12, there is a little gap between an outer circumferential surface of the bent portion 46 and the vessel body 12. In the film forming apparatus, a gap between the inner circumferential surface of the bent portion 46 and the outer end surface of the susceptor 2 and a gap between the outer circumferential surface of the bent portion 46 and the vessel body 12 may be set to, for example, a dimension that is the same as the height of the ceiling surface 44 from the upper surface of the susceptor 2.

Referring back to FIG. 4, a first exhaust port 610 communicating with the space 482 (FIG. 4) and a second exhaust port 620 communicating with the space 481 (FIG. 4) are formed between the susceptor 2 and the inner circumferential surface of the vessel body. The first exhaust port 610 is connected to a vacuum exhausting means (dry pump 68) through the exhaust pipe 63, as illustrated in FIG. 2. In addition, the automatic pressure regulator 64 is installed in a path which is to the vacuum exhausting means (dry pump 68) of the exhaust pipe 63. Similarly, the second exhaust port 620 is connected to a vacuum exhausting means such as a dry pump, through an exhaust pipe and an automatic pressure regulator (not illustrated).

As illustrated in FIG. 2, a heater unit 7 as a heating means is installed in a space between the susceptor 2 and the lower part 14 of the processing chamber 1. The wafer W on the susceptor 2 is heated to a temperature (for example, 450° C.) determined by a process recipe via the susceptor 2. A ring-shaped cover member 81 is disposed below the susceptor 2 close to the periphery of the susceptor 2, in order to prevent gas from entering into a space under the susceptor 2.

A vaporizer for supplying gas, a mass flow controller, an automatic pressure controller, a valve, and the like (not illustrated) are connected to each of the gas nozzles 31, 32, 41, and 42. A gas source for supplying $N_2$ or the like, a mass flow controller, an automatic pressure controller, a valve, and the like (not illustrated) are connected to each separation gas supply tube 51 and purge gas supply tubes 82 and 83.

At a side of the first exhaust port 610 in the processing chamber 1, the cleaning gas supplying tube 12a is provided. To the cleaning gas supplying tube 12a, a gas source for supplying cleaning gas, a mass flow controller, an automatic pressure controller, a valve, and the like (not illustrated) are connected.

One of the above gas nozzles 31, 32, 41, and 42 may serve both as a gas nozzle for supplying a source gas and a cleaning gas supplying tube for supplying a cleaning gas. In this case, for example, to the process gas nozzle 31, a gas source for cleaning gas is also connected, in addition to the above mentioned vaporizer or the like. Note that the gas source for cleaning gas may be connected to the process gas nozzle 31 via a valve or the like so that supplying the cleaning gas can be allowed or stopped. Alternatively, cleaning gas supplying tubes dedicated to the supply of the cleaning gas may be provided near the gas nozzles 31, 32, 41, and 42.

The control unit 100 illustrated in FIG. 2 is a means for instructing each element of the film forming apparatus to operate, and controlling an operation of each of the elements. In the film forming apparatus, the control unit 100 is configured by a computer for controlling an overall operation of the film forming apparatus. For example, the control unit 100 executes a program stored in a memory unit 101 while interoperating with hardware, to form film on surfaces of substrates. Also, the control unit 100 may be configured by a processing device including a general CPU (Central Processing Unit), a memory (such as a ROM or a RAM), and the like.

Specifically, the control unit 100 can store, in its internal memory, a program for causing the film forming apparatus to perform a film forming method (to be described below). The program may be formed of, for example, multiple steps. The control unit 100 can read out the program stored in a recording medium 102 (a hard disk, a compact disk, a magneto-optical disk, a memory card, a flexible disk, or the like) into the memory unit 101, and then install the program into the control unit 100.

Though an example of the film forming apparatus according to the present embodiment has been described above, the cleaning method of an exhaust pipe according to the present embodiment is applicable to any type of film forming apparatus such as an ALD apparatus or a CVD apparatus, as long as the film forming apparatus is equipped with a dedicated cleaning gas supplying tube, or any of the gas nozzles in the film forming apparatus serves as a cleaning gas supplying tube for supplying a cleaning gas.

[Film Forming Method]

The film forming process is performed, for example, in the following steps. A substrate (wafer W) on which film is to be formed is loaded from the transfer port 15 into the processing chamber 1 and is placed on the substrate placing regions by using a transfer arm 10 (FIG. 4). After the substrate is loaded into the processing chamber 1, the transfer port 15 is closed by a gate valve (not illustrated). Next, by rotating the susceptor 2, the wafer W is moved. Next, the inside of the processing chamber 1 is discharged by the exhaust system including the exhaust pipes 63, 65, 66, 69, and 71 (also including the flexible pipe 67), and a source gas such as hexachlorosilane and a reactant gas such as ammonia are supplied from the gas nozzles 31 and 32 into the processing chamber 1, while adjusting a pressure inside the processing chamber 1 by the automatic pressure regulator 64. Then, by heating the inside of the processing chamber 1, chemical reaction of the source gas is caused, and film such as silicon nitride film is deposited on the substrate by ALD.

As the source gas to be supplied from the process gas nozzle 31, in a case in which silicon nitride film is to be formed, gas of a compound containing Si and at least one of Cl and H can be used as the source gas. The gas may, for example, form chlorosilane polymer in the exhaust pipe. For example, silicon-containing gas such as chlorosilanes such as dichlorosilane, trichlorosilane, tetrachlorosilane, and hexachlorosilane, may be used. Alternatively, as silicon-containing gas, silanes such as silane or disilane may be used. As the reactant gas supplied from the gas nozzle 32, nitrogen-containing gas such as ammonia may be used.

[Cleaning Method of Exhaust Pipe]

The cleaning method of an exhaust pipe according to the present embodiment is for cleaning the exhaust pipes 63, 65, 66, 69, and 71 (also including the flexible pipe 67). In the method, a component adhering to the exhaust pipes, which is derived from a source gas for forming film and which is generated when the source gas is supplied into the processing chamber 1, is removed.

The cleaning method of an exhaust pipe according to the present embodiment can be performed, for example, during a certain period of the film forming process. The cleaning method may also be performed during a certain period of time when the film forming apparatus is being operated but the film forming process is not being performed. For example, the cleaning method may be performed during a time when a wafer W is conveyed, which is a time between film forming recipes (after completion of a process according to one film forming recipe and before starting a process according to another film forming recipe).

The above mentioned component adhering to the exhaust pipe which is derived from a source gas is, for example, a byproduct generated by a chemical reaction of a source gas and deposited on an inner surface of the exhaust pipe. Alternatively, the component may be a source gas containing harmful material that has adhered to the exhaust pipe and remains in the exhaust pipe. An example of the component adhering to the exhaust pipe which is derived from a source gas includes chlorosilane polymer, in a case in which silicon nitride film is to be formed.

The cleaning method of an exhaust pipe according to the present embodiment supplies, to the exhaust pipes 63, 65, 66, 69, and 71 (also including the flexible pipe 67), a cleaning gas capable of causing the above mentioned component adhering to the exhaust pipe, which is derived from a source gas, to change into an evaporable substance by chemical reaction in the atmosphere inside the exhaust pipes 63, 65, 66, 69, and 71 (also including the flexible pipe 67). Accordingly, the component adhering to the exhaust pipes 63, 65, 66, 69, and 71 (also including the flexible pipe 67) which is derived from a source gas is removed by causing the component to react with the cleaning gas in order to vaporize the component. The term "evaporable substance" means that the substance has sufficient vapor pressure to be vaporized under the atmosphere inside the exhaust pipes 63, 65, 66, 69, and 71 (also including the flexible pipe 67).

The above mentioned cleaning gas is gas capable of causing the component adhering to the exhaust pipe which is derived from a source gas to change into an evaporable substance by chemical reaction in the atmosphere inside the exhaust pipes 63, 65, 66, 69, and 71 (also including the flexible pipe 67). For example, in a case in which silicon nitride film is formed, chlorosilane polymer may adhere to the exhaust pipes 63, 65, 66, 69, and 71 (also including the flexible pipe 67). Examples of gas capable of causing an Si-containing compound to change into an evaporable substance by chemical reaction in the atmosphere inside the exhaust pipes 63, 65, 66, 69, and 71 (also including the flexible pipe 67) includes a fluorine-based gas, a chlorine-based gas, and a halogen-based gas. For example, $ClF_3$ can be used as a cleaning gas. For example, as $SiF_4$, which is generated by reacting an Si-containing compound such as chlorosilane polymer with $ClF_3$, is evaporable in the atmosphere inside the exhaust pipes 63, 65, 66, 69, and 71 (also including the flexible pipe 67), $SiF_4$ is removed by the exhaust system as gas.

At a step of supplying a cleaning gas to the exhaust pipes 63, 65, 66, 69, and 71 (also including the flexible pipe 67), the cleaning gas is supplied, for example, from the process gas nozzle 31 to the exhaust pipes 63, 65, 66, 69, and 71 (also including the flexible pipe 67), via the processing chamber 1. This is applicable in a case in which the gas nozzle 31 serves both as a gas supplying tube for supplying a source gas and a cleaning gas supplying tube for supplying a cleaning gas.

Alternatively, in a case in which the cleaning gas supplying tubes 12a are provided in a vicinity of joints between the exhaust pipes 63, 65, 66, 69, and 71 (also including the flexible pipe 67) and the processing chamber 1, the cleaning gas is supplied from the cleaning gas supplying tubes 12a to the exhaust pipes 63, 65, 66, 69, and 71 (also including the flexible pipe 67) without passing through the processing chamber 1, at a step of supplying a cleaning gas to the exhaust pipes 63, 65, 66, 69, and 71 (also including the flexible pipe 67).

The above mentioned step of supplying a cleaning gas to the exhaust pipes 63, 65, 66, 69, and 71 (also including the flexible pipe 67) is performed while the exhaust system such as the dry pump 68 is operating (that is, while gas discharging is being performed in the exhaust system). This is to remove the component adhering to the exhaust pipe by causing the component to react with the cleaning gas in order to vaporize the component.

Next, a process sequence of the cleaning method of an exhaust pipe according to the present embodiment will be described with reference to FIG. 6. Charts (A) to (C) in FIG. 6 are timing charts illustrating examples of operations of the film forming apparatus.

The chart (A) in FIG. 6 illustrates a case in which a cleaning process is performed while a film forming process is being performed. This is applicable in a case in which a cleaning gas is supplied from the cleaning gas supplying tube 12a to the exhaust pipes 63, 65, 66, 69, and 71 (also including the flexible pipe 67) without passing through the processing chamber 1. At time t1, a first recipe R1 is started. In the first recipe R1, after a pre-deposition period PR has passed, a deposition (film forming) period F is started at time t2. The deposition period F terminates at time t3. After a post-deposition period PO has passed, the first recipe R1 terminates (at time t4 in the chart (A)). In the pre-deposition period PR, for example, loading of a wafer W before processing into the processing chamber 1, adjustment of pressure or temperature in the processing chamber 1, nitriding treatment or oxidation treatment of a surface of the wafer W, and the like, are performed. In the post-deposition period PO, for example, unloading of the wafer W from the processing chamber 1, modification treatment (such as nitriding treatment or oxidation treatment) of film formed on the surface of the wafer W, and the like, are performed. In the above described process sequence, a source gas for film forming is supplied during the deposition period F which begins at time t2 and ends at time t3. A cleaning period C for supplying a cleaning gas begins at time t2 and ends at time t3. Alternatively, the cleaning period C may be extended and may end at time t4 or thereafter. In the above described process sequence, the cleaning gas is supplied to the exhaust pipes 63, 65, 66, 69, and 71 (also including the flexible pipe 67) during a given period while a film forming process is being performed in the processing chamber 1. Because the cleaning gas is directly supplied from the cleaning gas supplying tube 12a to the exhaust pipes 63, 65, 66, 69, and 71 (also including the flexible pipe 67) without passing through the processing chamber 1, the cleaning period C may be placed in the same period as the deposition period F. Because film forming and cleaning are performed simultaneously, cleaning can be completed without downtime.

The chart (B) in FIG. 6 illustrates a case in which a cleaning process is performed during a period when the film forming apparatus is being operated but the film forming process is not being performed. This is applicable in both cases, in which a cleaning gas is supplied from the cleaning gas supplying tube 12a to the exhaust pipes 63, 65, 66, 69, and 71 (also including the flexible pipe 67) without passing through the processing chamber 1, and in which a cleaning gas is supplied from the process gas nozzle 31 to the exhaust pipes 63, 65, 66, 69, and 71 (also including the flexible pipe 67), via the processing chamber 1. At time t1, the first recipe R1 is started. After the pre-deposition period PR has passed, the deposition period F is started at time t2. The deposition period F terminates at time t3. After a post-deposition period PO has passed, the first recipe R1 terminates at time t4. Thereafter, a second recipe R2 is started at time t5. After a pre-deposition period PR has passed, a deposition period F is started at time t6. The deposition period F terminates at time t9. After a post-deposition period PO has passed, the second recipe R2 terminates at time t10. During a period between the recipes (R1 and R2), a movement of the wafer W other than loading/unloading of the wafer W, a preparation operation and the like, are performed. In the above described process sequence, a source gas for film forming is supplied during one deposition period F which begins at time t2 and ends at time t3 and another deposition period F which begins at time t6 and ends at time t9. A cleaning period C for supplying a cleaning gas begins at time t3 and ends at time t6, which is a period from a time when the deposition period F of the first recipe R1 ends, to a time when the deposition period F of the second recipe R2 starts. In the above described process sequence, the cleaning gas is supplied to the exhaust pipes 63, 65, 66, 69, and 71 (also including the flexible pipe 67) during a given period when the film forming apparatus is being operated but the film forming process is not being performed in the processing chamber 1. The cleaning gas may be supplied from either the process gas nozzle 31 or the cleaning gas supplying tube 12a. Also, the cleaning gas may be supplied from both the process gas nozzle 31 and the cleaning gas supplying tube 12a. Because cleaning is performed during a period between recipes in which a conveyance of a wafer W or the like is performed, or is performed during the post-deposition period PO and the pre-deposition period PR, cleaning can be completed without downtime.

The chart (C) in FIG. 6 illustrates a case in which a cleaning process is performed during a period when the film forming apparatus is being operated but the film forming process is not being performed. This is applicable in both cases, in which a cleaning gas is supplied from the cleaning gas supplying tube 12a to the exhaust pipes 63, 65, 66, 69, and 71 (also including the flexible pipe 67) without passing through the processing chamber 1, and in which a cleaning gas is supplied from the process gas nozzle 31 to the exhaust pipes 63, 65, 66, 69, and 71 (also including the flexible pipe 67), via the processing chamber 1. At time t1, the first recipe R1 is started. After the pre-deposition period PR has passed, the deposition period F is started at time t2. The deposition period F terminates at time t3. After a post-deposition period PO has passed, the first recipe R1 terminates at time t4. Thereafter, the second recipe R2 is started at time t7. After the pre-deposition period PR has passed, a deposition period F is started at time t8. The deposition period F terminates at time t11. After the post-deposition period PO has passed, the second recipe R2 terminates at time t12. In the above described process sequence, a source gas for film forming is supplied during one deposition period F which begins at time t2 and ends at time t3 and another deposition period F which begins at time t8 and ends at time t11. The cleaning period C for supplying a cleaning gas begins at time t4 and ends at time t7, which is a period from a time when the first recipe R1 terminates to a time when the second recipe R2 starts. In the above described process sequence, the cleaning gas is supplied to the exhaust pipes 63, 65, 66, 69, and 71 (also including the flexible pipe 67) during a given period when the film forming process is not being performed in the processing chamber 1. The cleaning gas may be supplied from either the process gas nozzle 31 or the cleaning gas supplying tube 12a. Also, the cleaning gas may be supplied from both the process gas nozzle 31 and the cleaning gas supplying tube 12a. Because cleaning is performed during a period between recipes in which a conveyance of a wafer W or the like is performed, cleaning can be completed without downtime.

The process sequences illustrated in the charts (A) to (C) may be performed by combining the process sequences.

A time required for cleaning a component adhering to the exhaust pipe, such as a byproduct, will become longer if an amount of the component adhering to the exhaust pipe is excessive. Thus, if cleaning is performed while an amount of the component adhering to the exhaust pipe is small, the exhaust pipe can be surely cleaned in a short time. For example, it is preferable that cleaning of the exhaust pipe is performed for each execution of a film forming recipe. In a case in which cleaning of the exhaust pipe is performed for each execution of a recipe, the cleaning can be performed in accordance with any of the charts (A) to (C) in FIG. 6.

In the cleaning method according to the present embodiment, at a step of supplying a cleaning gas to the exhaust pipes 63, 65, 66, 69, and 71 (also including the flexible pipe 67), a remaining state of a component adhering to the exhaust pipe is checked, by monitoring a substance evaporable in the atmosphere inside the exhaust pipes 63, 65, 66, 69, and 71 (also including the flexible pipe 67), which is generated by chemical reaction of the component adhering to the exhaust pipe with the cleaning gas. By performing the checking, completion of cleaning (removal) of a component adhering to the exhaust pipe can be detected, for example. In a case in which silicon nitride film is to be formed and in which $ClF_3$ is used as a cleaning gas for removing chlorosilane polymer, $SiF_4$ is generated by reacting chlorosilane polymer with $ClF_3$. In this case, by monitoring concentration of $SiF_4$ inside the exhaust pipes 63, 65, 66, 69, and 71 (also including the flexible pipe 67), a remaining state of chlorosilane polymer is checked. The monitoring of the concentration of $SiF_4$ can be performed by, for example, the FT-IR spectrometer 70 connected in the middle of the exhaust pipe 69.

In the cleaning method of an exhaust pipe according to the present embodiment, after the step of supplying a cleaning gas to the exhaust pipes 63, 65, 66, 69, and 71 (also including the flexible pipe 67), maintenance of an inside of the exhaust pipes 63, 65, 66, 69, and 71 (also including the flexible pipe 67) is performed by the exhaust pipes 63, 65, 66, 69, and 71 (also including the flexible pipe 67) being opened to the atmosphere. For example, after completion of cleaning (removal) of a component adhering to the exhaust pipe is detected, the exhaust pipe may be opened to the atmosphere safely. According to the cleaning method of the present embodiment, without isolating the exhaust pipe, maintenance of the exhaust pipe can be performed safely with the exhaust pipe opened to the atmosphere.

In the cleaning method according to the present embodiment, $ClF_3$ is supplied to the exhaust system directly. As $ClF_3$ corrodes a dry pump and damage of the dry pump becomes larger because of $ClF_3$, it is preferable to use a dry pump to which a corrosion-preventing measure is applied. By strengthening heating measures for the exhaust pipe, an amount of a component such as a byproduct adhering to the exhaust pipe can be reduced. Further, by reducing an amount of supply of $ClF_3$, damage of a dry pump can be reduced.

As described above, according to the cleaning method of the present embodiment, without isolating the exhaust pipe, maintenance of the exhaust pipe can be performed with the exhaust pipe opened to the atmosphere safely.

First Example

In the first example, a set of a silicon nitride film forming process and a process of cleaning a byproduct (cleaning process) were performed 10 times, using the film forming apparatus according to the above described embodiment. In the following, a period of time of the set of the silicon nitride film forming process and the cleaning process is referred to as a "cycle".

In the silicon nitride film forming process, trichlorosilane and ammonia were used, and the silicon nitride film forming process was performed under a process condition of a processing temperature of 760° C., a processing pressure of 4 Torr, a rotational speed of the susceptor of 10 rpm, a trichlorosilane flow rate of 200 sccm, and an ammonia flow rate of 8000 sccm. A processing time of the silicon nitride film forming process per cycle was 550 s.

Figure 7:
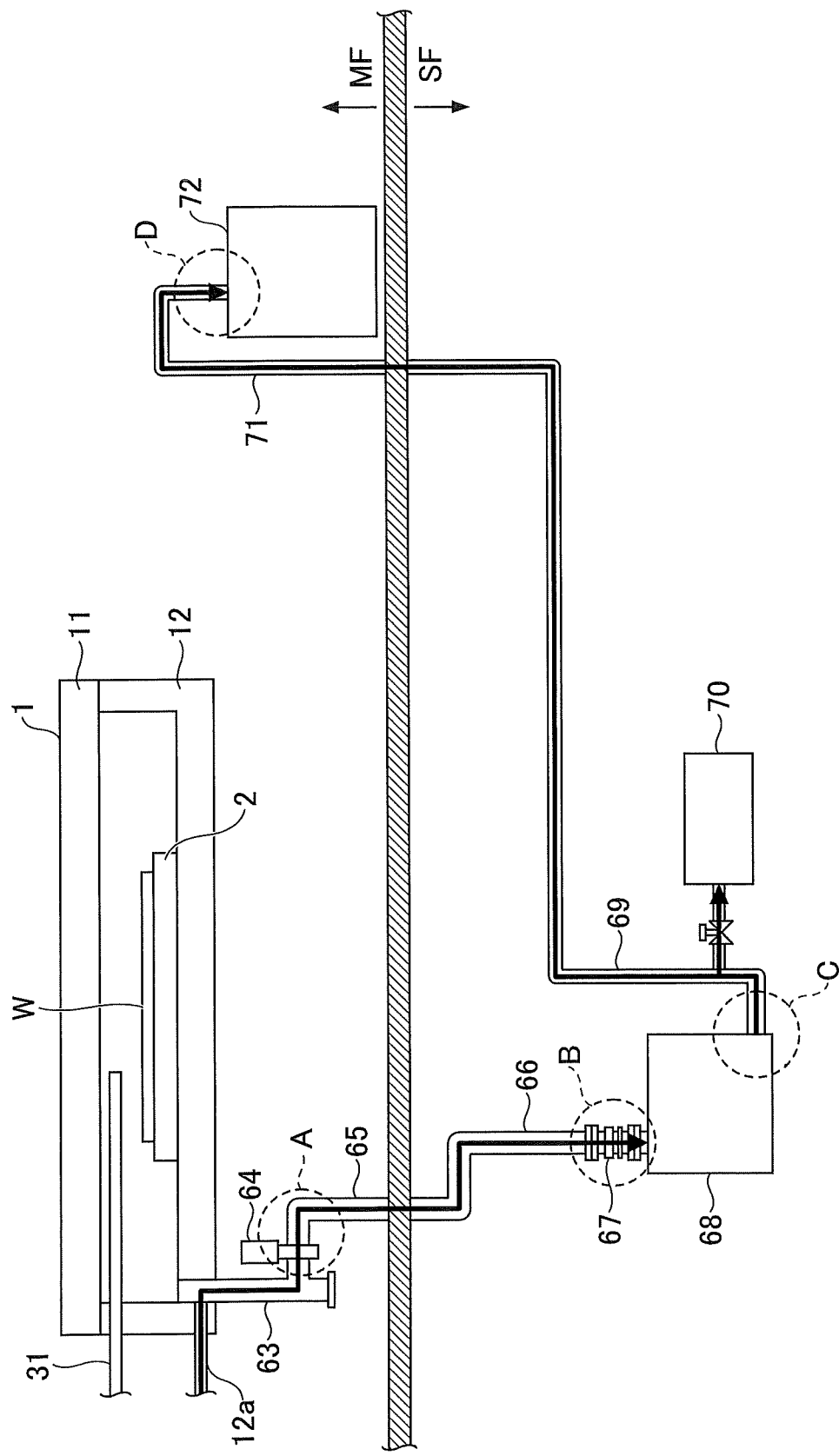
FIG. 7 is a diagram illustrating a route of a cleaning gas and points which were opened to the atmosphere in a cleaning method of an exhaust pipe in a first example.

FIG. 7 is a diagram illustrating a route of a cleaning gas and points which were opened to the atmosphere in the cleaning process of the exhaust pipe in the first example. The cleaning gas was supplied from the cleaning gas supplying tube 12a. In the cleaning process of the exhaust pipe, $ClF_3$ is used as the cleaning gas. The cleaning process was performed under a process condition of a processing temperature of 760° C., a processing pressure of 6.7 Torr, a rotational speed of the susceptor of 6 rpm, and a $ClF_3$ flow rate of 1000 sccm. A processing time of the cleaning process per cycle was 600 s. Also, the cleaning process was performed while monitoring $SiF_4$ by the FT-IR spectrometer 70.

The above described film forming process and cleaning process were performed while heating the exhaust system at 90° C.

Figure 8:
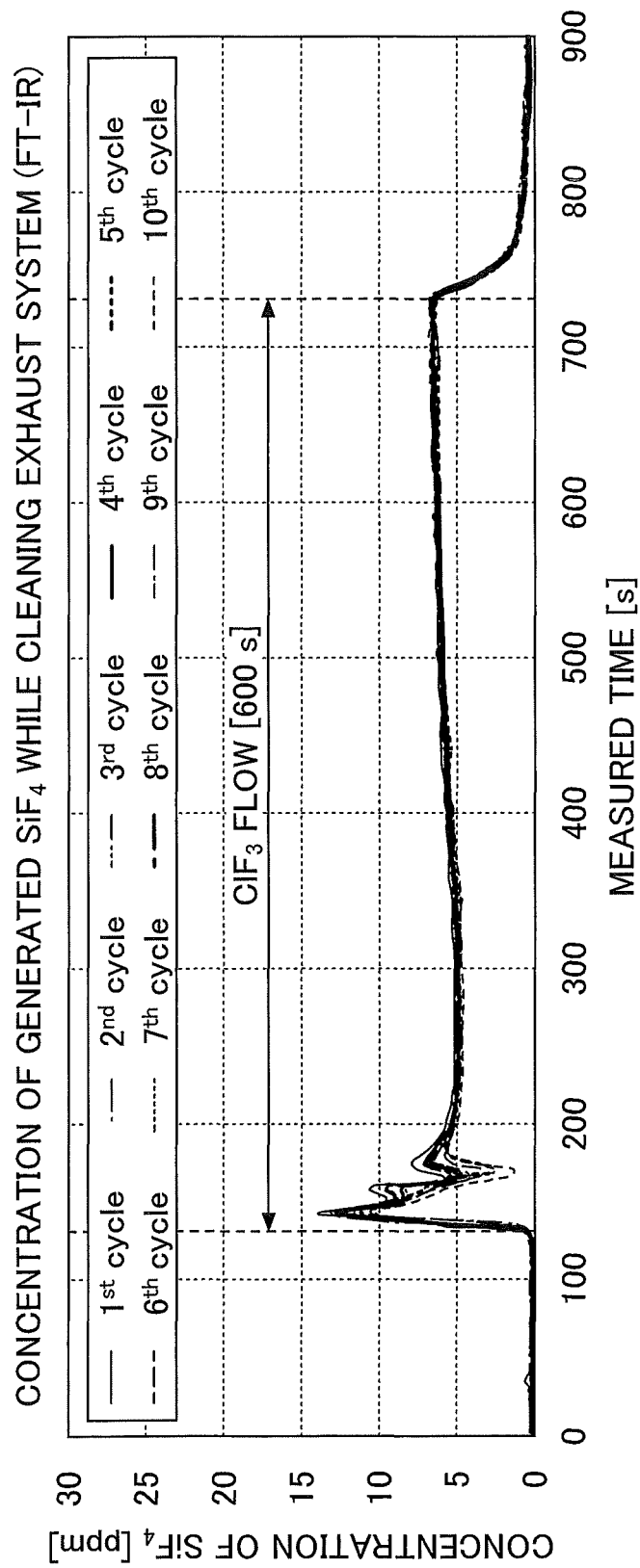
FIG. 8 is a graph illustrating a variance of concentration of $SiF_4$ measured by FT-IR with passage of time in the first example.

FIG. 8 is a graph illustrating a variance of concentration of $SiF_4$ measured by FT-IR (Fourier Transform Infrared Spectroscopy) with passage of time during the above cleaning process. In the first example, ten sets (cycles) of the silicon nitride film forming process and the cleaning process were performed. As illustrated in FIG. 8, no significant difference in concentration of $SiF_4$ was found between measured results in the first cycle to tenth cycle. That is, it is assumed that chlorosilane polymer which was generated by the film forming process in one cycle has been removed, by performing the above mentioned cleaning process of 600 s per cycle.

Further, after ten cycles of the film forming process and cleaning process were performed, some points of the exhaust system were opened to the atmosphere. Specifically, points where circles of dotted-lines are attached in FIG. 7 (circles A to D) were opened to the atmosphere. The circle A corresponds to a flange of a secondary side of the automatic pressure regulator 64, the circle B corresponds to the flexible pipe 67, the circle C corresponds to an outlet of a secondary side of the dry pump 68, and the circle D corresponds to an inlet of the detoxifying device 72. At each of the points having been opened to the atmosphere, concentration of HCl was measured. Just after the points were opened to the atmosphere, concentration of HCl was 0 ppm at the points A, B, and D, and 1.6 ppm at the point C. At a time 10 minutes after the points were opened to the atmosphere, concentration of HCl was 0 ppm at all points A, B, C, and D. That is, a component which generates HCl when the exhaust pipe is opened to the atmosphere was hardly found in the exhaust pipe. An example of a component which generates HCl when the exhaust pipe is opened to the atmosphere includes a compound containing Si—Cl—N—H.

On the other hand, if the cleaning was not performed in the above experiment, concentration of HCl was more than 6 ppm (6 ppm is a value exceeding an upper limit of a detecting device).

As described above, in the first example, as a result of repeating a set of the film forming process and cleaning process ten times (ten cycles), chlorosilane polymer, which was generated by the film forming process performed in each cycle, was able to be removed. Also, a component which generates HCl when the exhaust pipe is opened to the atmosphere did not substantially remain.

Second Example

Figure 9:
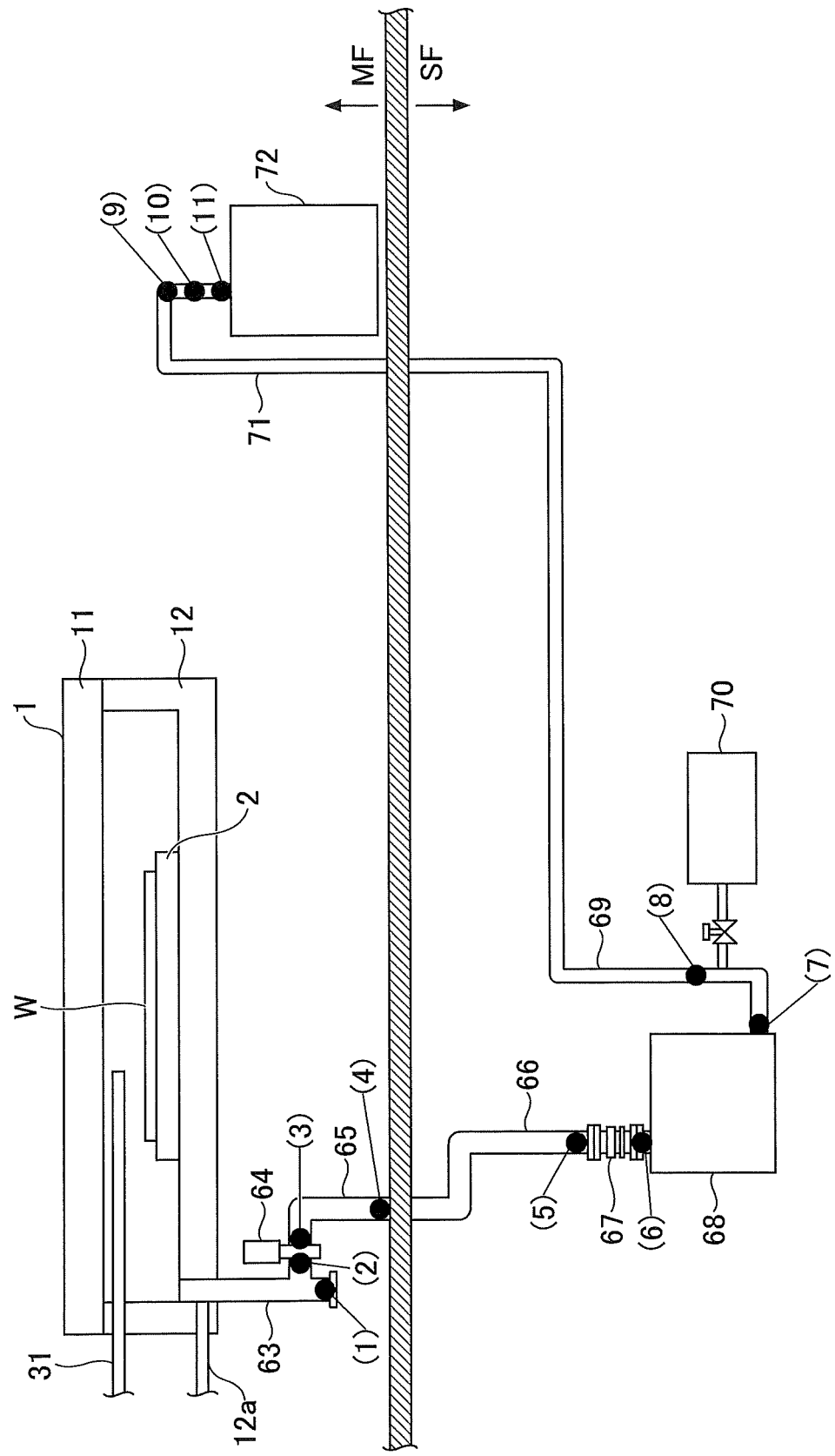
FIG. 9 is a diagram illustrating points of an exhaust system which were opened to the atmosphere in a cleaning method of an exhaust pipe in a second example.

After ten sets of the silicon nitride film forming process and the process of cleaning a byproduct (cleaning process) were performed in the film forming apparatus, the exhaust system was opened to the atmosphere. FIG. 9 is a diagram illustrating points of the exhaust system which were opened to the atmosphere in a cleaning method of an exhaust pipe in the second example. 11 points indicated in FIG. 9 ((1) to (11) in FIG. 9) were opened to the atmosphere, and with respect to these points, whether a component adhering to the exhaust pipe remained or not was visually checked. The following points were opened to the atmosphere: (1) a dead end part of the exhaust pipe 63, (2) a flange of a primary side of the automatic pressure regulator 64, (3) a flange of a secondary side of the automatic pressure regulator 64, (4) a part of the exhaust pipe 65 above floor level, (5) the flexible pipe 67, (6) an inlet of a primary side of the dry pump 68, (7) an outlet of a secondary side of the dry pump 68, (8) a part of the exhaust pipe 69, (9) a primary side of a flexible pipe above the detoxifying device 72, (10) a secondary side of the flexible pipe above the detoxifying device 72, and (11) an inlet of the detoxifying device 72.

As a result of the visual check of the exhaust system, components adhering to the exhaust pipe were observed at the points (3), (7), and (11) in FIG. 9. At other points, components adhering to the exhaust pipe were not recognized.

Figure 10:
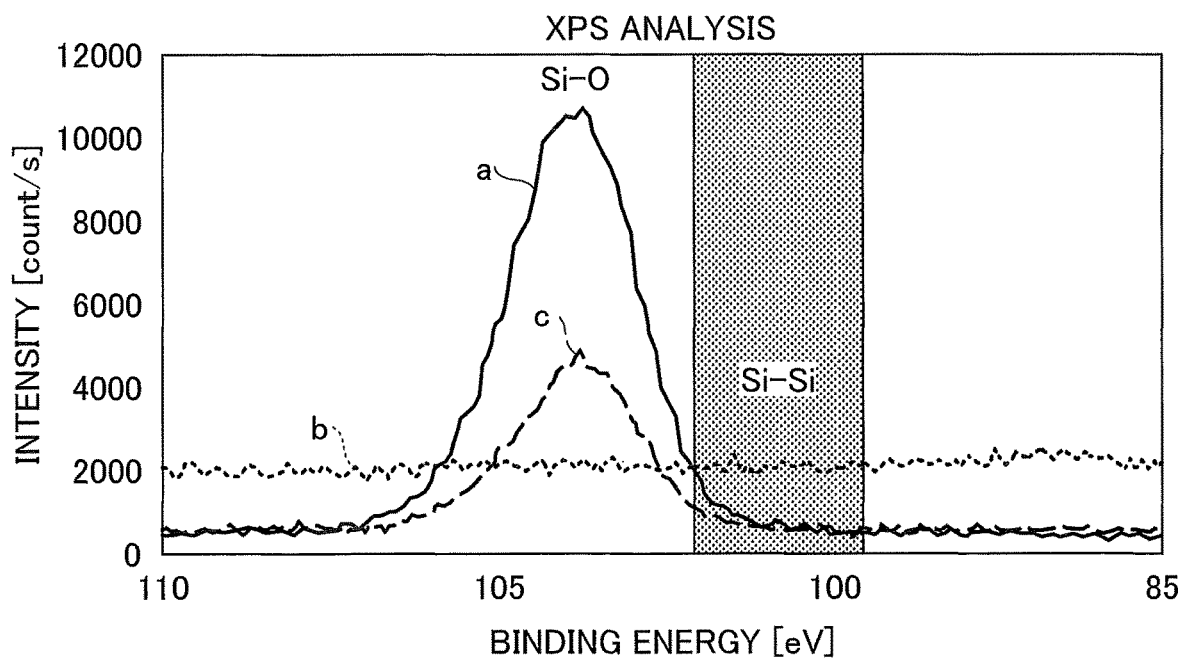
FIG. 10 is a graph illustrating a result of XPS analysis performed in the second example.

In the second example, components adhering to the exhaust pipe were collected at the points (3), (7), and (11) in FIG. 9, and the collected components were analyzed based on XPS analysis (X-ray photoelectron spectroscopy analysis). FIG. 10 is a graph illustrating a result of XPS analysis covering a region of binding energy corresponding to Si—Si bonding. In FIG. 10, a solid line "a" represents an analysis result of the component collected at the point (3) in FIG. 9, a dotted line "b" represents an analysis result of the component collected at the point (7) in FIG. 9, and a dashed line "c" represents an analysis result of the component collected at the point (11) in FIG. 9. As illustrated in FIG. 10, a peak of XPS intensity did not exist within the region of binding energy corresponding to Si—Si bonding, in any of the solid line "a", the dotted line "b", and the dashed line "c". This means that the components collected at each of the points are not compounds containing Si—Si bonding. That is, it was found that the collected components were not chlorosilane polymer or chlorosilane hydrolysate.

Figure 11:
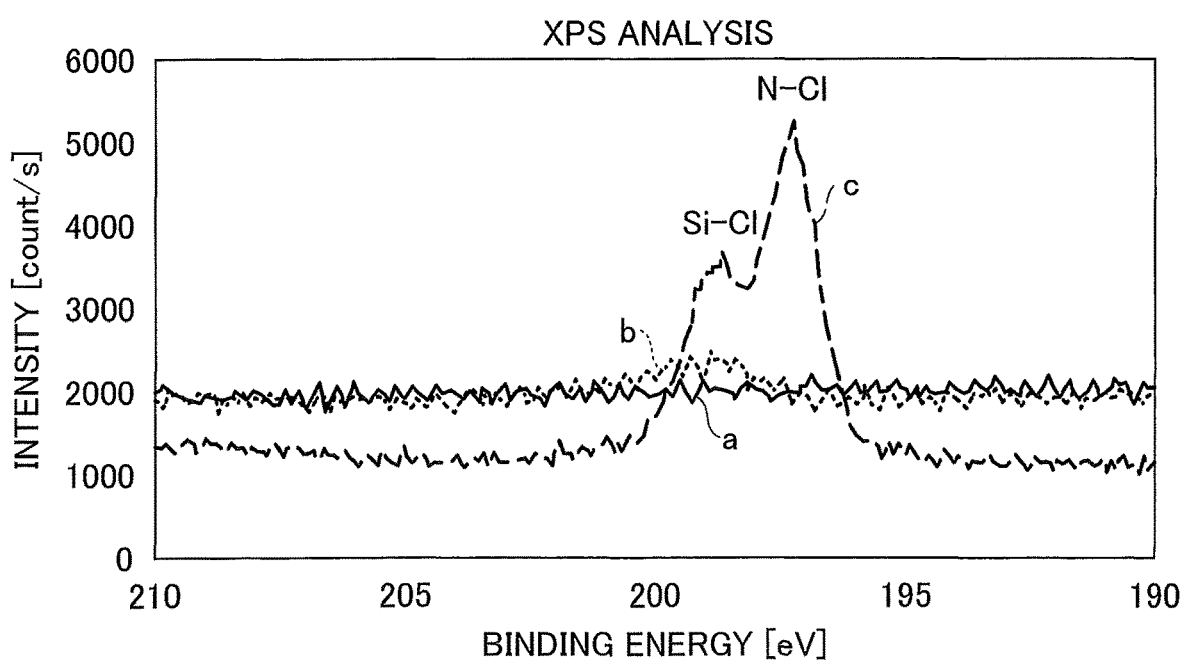
FIG. 11 is a graph illustrating a result of XPS analysis performed in the second example.

FIG. 11 is a graph illustrating a result of XPS analysis covering a region of binding energy corresponding to Si—Cl bonding or corresponding to N—Cl bonding. In FIG. 11, a solid line "a" represents an analysis result of the component collected at the point (3) in FIG. 9, a dotted line "b" represents an analysis result of the component collected at the point (7) in FIG. 9, and a dashed line "c" represents an analysis result of the component collected at the point (11)

in FIG. 9. As illustrated in FIG. 11, it was confirmed that the component corresponding to the dashed line "c" contains compounds having Si—Cl bonding and N—Cl bonding. With respect to the solid line "a" and the dotted line "b", it was confirmed that compounds having Si—Cl bonding and N—Cl bonding were not contained in the components corresponding to the solid line "a" and the dotted line "b".

As described above, in the second example, as a result of repeating a set of the film forming process and cleaning process ten times (ten cycles), it was confirmed that chlorosilane polymer or chlorosilane hydrolysate was not left inside the exhaust pipes.

Although the embodiments of the present invention have been described above, the present invention is not limited to the specific embodiments described above. Various changes or enhancements can be made hereto within the scope of the present invention.

What is claimed is:

1. A method of cleaning an exhaust pipe for removing a component adhering to the exhaust pipe in a film forming apparatus, the film forming apparatus including a processing chamber, a gas supply part configured to supply gas to the processing chamber, the exhaust pipe connected to the processing chamber, a cleaning gas supply part disposed in a vicinity of a joint between the processing chamber and the exhaust pipe, and a Fourier transform infrared spectrometer provided in a middle of the exhaust pipe, the component being chlorosilane polymer generated from a source gas for forming film when the source gas is supplied into the processing chamber from the gas supply part, the method comprising:

supplying a cleaning gas directly from the cleaning gas supply part to the exhaust pipe without passing through the processing chamber, thereby causing the component to be removed from the exhaust pipe by causing the component to vaporize upon reacting with the cleaning gas, the cleaning gas being capable of causing the component adhering to the exhaust pipe to change into an evaporable substance by chemical reaction in an atmosphere inside the exhaust pipe; and measuring, by using the Fourier transform infrared spectrometer, concentration of $SiF_4$ inside the exhaust pipe that is generated by reacting the component adhering to the exhaust pipe with the cleaning gas, evaporable substance, in order to check a remaining state of the component adhering to the exhaust pipe, the measuring being performed in parallel with the supplying of the cleaning gas; wherein the supplying is performed while a process of depositing a film on a substrate is being performed in the processing chamber, and while the process of depositing the film on the substrate is not performed in the processing chamber and the substrate is being unloaded from the processing chamber.

2. The method according to claim 1, wherein the source gas is a gas of a compound including Si and one of Cl and H, or including Si, Cl, and H.

3. The method according to claim 1, wherein the cleaning gas is $ClF_3$.

4. The method according to claim 1, further comprising:

performing maintenance of an inside of the exhaust pipe with the exhaust pipe opened to the atmosphere, after the supplying.

* * * * *